(12) United States Patent
Shirahase et al.

(10) Patent No.: US 10,581,019 B2
(45) Date of Patent: Mar. 3, 2020

(54) ORGANIC EL ELEMENT HAVING REDUCED ELECTRIC POWER CONSUMPTION BY OPTIMIZING FILM THICKNESSES THEREOF AND METHOD OF MANUFACTURING SAME

(71) Applicant: JOLED INC., Tokyo (JP)

(72) Inventors: Hideyuki Shirahase, Tokyo (JP); Hiroyuki Ajiki, Tokyo (JP); Jun Hashimoto, Tokyo (JP); Masaki Nishimura, Tokyo (JP)

(73) Assignee: JOLED INC., Tokyo (JP)

( * ) Notice: Subject to any disclaimer, the term of this patent is extended or adjusted under 35 U.S.C. 154(b) by 53 days.

(21) Appl. No.: 15/715,800

(22) Filed: Sep. 26, 2017

(65) Prior Publication Data

US 2018/0090716 A1    Mar. 29, 2018

(30) Foreign Application Priority Data

Sep. 28, 2016  (JP) ................. 2016-190031

(51) Int. Cl.
| | |
|---|---|
| *H01L 29/08* | (2006.01) |
| *H01L 51/52* | (2006.01) |
| *H01L 51/50* | (2006.01) |
| *H01L 27/32* | (2006.01) |
| *H01L 51/56* | (2006.01) |

(52) U.S. Cl.
CPC ...... *H01L 51/5265* (2013.01); *H01L 27/3244* (2013.01); *H01L 51/5008* (2013.01); *H01L 51/5012* (2013.01); *H01L 51/5076* (2013.01); *H01L 51/5092* (2013.01); *H01L 51/5218* (2013.01); *H01L 51/5234* (2013.01); *H01L 51/56* (2013.01); *H01L 27/3211* (2013.01); *H01L 2251/301* (2013.01); *H01L 2251/308* (2013.01); *H01L 2251/5315* (2013.01); *H01L 2251/558* (2013.01)

(58) Field of Classification Search
None
See application file for complete search history.

(56) References Cited

U.S. PATENT DOCUMENTS

| | | |
|---|---|---|
| 5,443,922 A | 8/1995 | Nishizaki et al. |
| 2012/0104423 A1 | 5/2012 | Kurata et al. |

(Continued)

FOREIGN PATENT DOCUMENTS

| | | |
|---|---|---|
| JP | 05163488 A | 6/1993 |
| WO | 2012/020452 A1 | 2/2012 |

*Primary Examiner* — Matthew E. Gordon
(74) *Attorney, Agent, or Firm* — Chip Law Group

(57) ABSTRACT

An organic electroluminescence element includes an anode, a light-emitting layer disposed over the anode, a functional layer disposed on the light-emitting layer in contact with the light-emitting layer and including a first metal, a light-transmitting conductive layer disposed on the functional layer in contact with the functional layer and composed of a metallic oxide, and a cathode disposed on the light-transmitting conductive layer in contact with the light-transmitting conductive layer and composed of a metal. The functional layer has a film thickness of 15 to 35 nm. A surface of the anode on the light-emitting layer side and an interface between the cathode and the light-transmitting conductive layer are spaced from each other by not less than 150 nm.

6 Claims, 8 Drawing Sheets

(56) References Cited

U.S. PATENT DOCUMENTS

2012/0280214 A1\* 11/2012 Makino ............... H01L 51/5092
 257/40
2017/0309687 A1\* 10/2017 Watabe ............... H01L 51/5004

\* cited by examiner

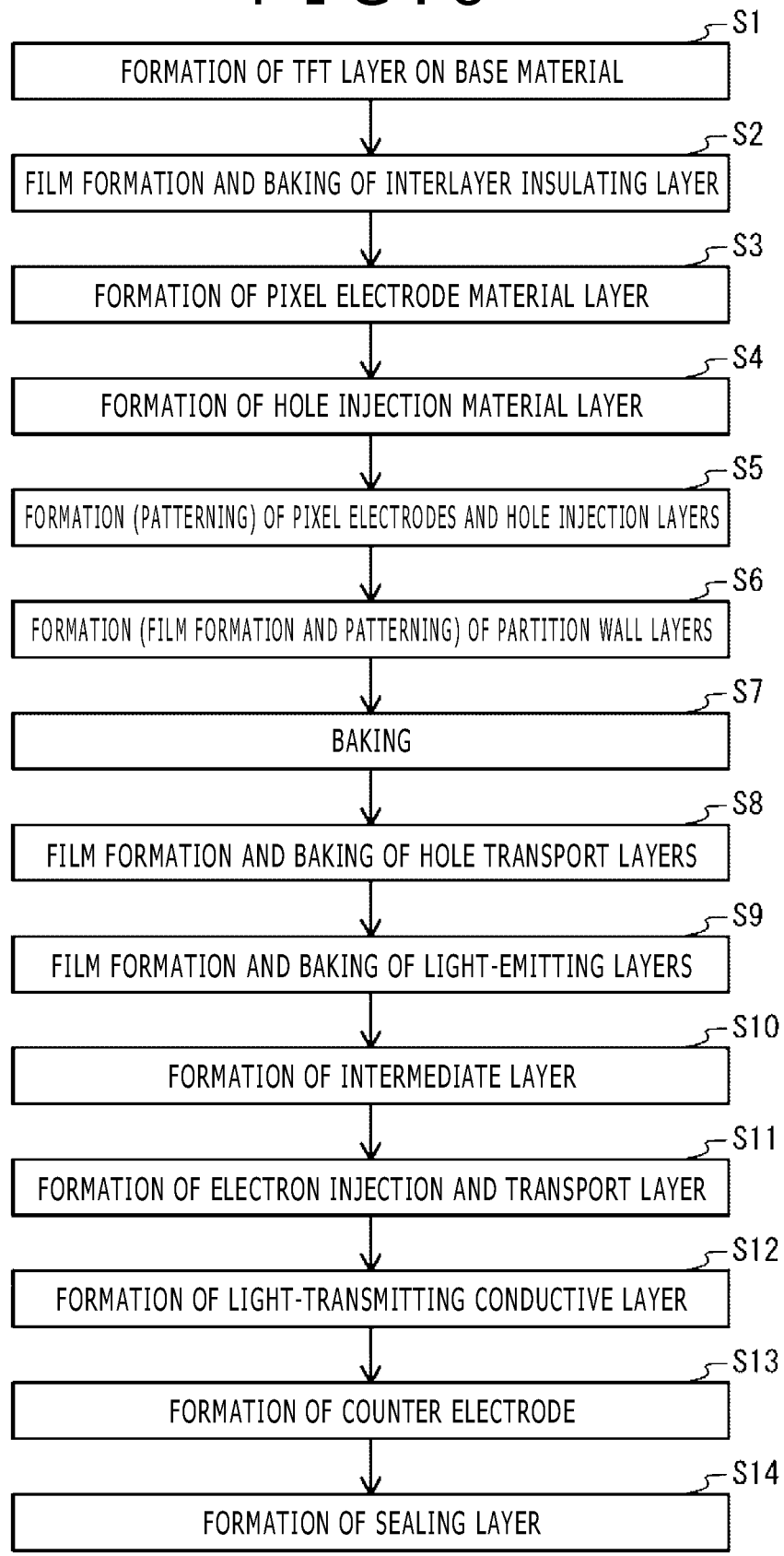

ORGANIC EL ELEMENT HAVING REDUCED ELECTRIC POWER CONSUMPTION BY OPTIMIZING FILM THICKNESSES THEREOF AND METHOD OF MANUFACTURING SAME

CROSS REFERENCE TO RELATED APPLICATIONS

This application claims priority benefit of Japanese Patent Application No. JP 2016-190031 filed in the Japan Patent Office on Sep. 28, 2016. Each of the above-referenced applications is hereby incorporated herein by reference in its entirety.

BACKGROUND

The present disclosure relates to an organic EL (electroluminescence) element and a method of manufacturing an organic EL element, particularly to an organic EL element having a resonator structure.

Organic EL elements have such characteristics as high visibility because of their self-luminescence and high shock resistance because of their being perfectly solid elements. Accordingly, display apparatuses utilizing organic EL elements have been spreading widely.

An organic EL element has a configuration wherein at least a light-emitting layer is sandwiched between a pair of electrodes (an anode and a cathode). In many cases, an organic EL element has a configuration wherein in addition to the light-emitting layer, functional layers (an electron transport layer and an electron injection layer) for supplying electrons to the light-emitting layer as well as a hole injection layer, a hole transport layer and the like are further sandwiched between the light-emitting layer and the cathode.

In the organic EL elements, it is desired to enhance the efficiency of extraction of light from each color light-emitting element, from the viewpoint of a reduction in electric power consumption and an increase in life. For enhancing the light extraction efficiency, a technology of adopting a resonator structure in organic EL elements for colors has been known, as described in, for example, PCT Patent Publication No. WO2012/020452.

SUMMARY

However, in the case where light is extracted by utilizing first-order light interference in a resonator structure, it is necessary to set the distance between a light-emitting layer and a light-transmitting electrode to be not less than 150 nm. On the other hand, an increase in the film thickness of the light-emitting layer causes a rise in driving voltage, which leads to an increase in electric power consumption of the organic EL element. In addition, in the case where the light-transmitting electrode is a cathode, increases in the film thicknesses of an electron transport layer and an electron injection layer cause a lowering in light extraction efficiency due to the absorption of light by a metal used for enhancing an electron-injecting property.

Thus, there is a need for an organic EL element in which light extraction efficiency is high and electric power consumption is small, and a method for manufacturing the organic EL element.

In accordance with one mode of the present disclosure, there is provided an organic EL element including: an anode; a light-emitting layer disposed over the anode; a functional layer disposed on the light-emitting layer in contact with the light-emitting layer and including a metallic material; a light-transmitting conductive layer disposed on the functional layer in contact with the functional layer and composed of a metallic oxide; and a cathode disposed on the light-transmitting conductive layer in contact with the light-transmitting conductive layer and composed of a metal, wherein the functional layer has a film thickness of 15 to 35 nm, and a surface of the anode on the light-emitting layer side and an interface between the cathode and the light-transmitting conductive layer are spaced from each other by not less than 150 nm.

In the organic EL element according to the described mode, the functional layer and the light-transmitting conductive layer are interposed between the light-emitting layer and the cathode. For this reason, it is possible to reduce electric power consumption by optimizing the film thicknesses of the light-emitting layer and the functional layer. In addition, with the film thickness of the light-transmitting conductive layer enlarged without enlarging the film thickness of the functional layer more than necessary, it is possible to restrain attenuation of light between the light-emitting layer and the cathode; in addition, it is possible to cause the distance between the light-emitting layer and the cathode to be a distance sufficient for extracting light through utilization of first-order light interference. In other words, the first-order light interference can be utilized without excessively enlarging the film thicknesses of the light-emitting layer and the functional layer, and, therefore, it is possible to lower the driving voltage and to enhance the light extraction efficiency.

BRIEF DESCRIPTION OF THE DRAWINGS

FIGS. 5A, 5B, 5C, 5D, and 5E are partial sectional views depicting schematically part of a manufacturing process of the organic EL element according to the embodiment, wherein FIG. 5A depicts a state in which a TFT (thin film transistor) layer is formed on a substrate, FIG. 5B depicts a state in which an interlayer insulating layer is formed on a substrate, FIG. 5C depicts a state in which a pixel electrode material layer is formed on the interlayer insulating layer, FIG. 5D depicts a state in which a hole injection material layer is formed on the pixel electrode material layer, and FIG. 5E depicts a state in which pixel electrodes and hole injection layers are formed;

FIGS. 6A, 6B, 6C, and 6D are partial sectional views depicting schematically part of the manufacturing process of the organic EL element according to the embodiment, wherein FIG. 6A depicts a state in which a partition wall material layer is formed on the interlayer insulating layer, pixel electrodes and hole injection layers, FIG. 6B depicts a state in which partition wall layers are formed, FIG. 6C depicts a state in which hole transport layers are formed on the hole injection layers, and FIG. 6D depicts a state in which light-emitting layers are formed on the hole injection layers;

FIGS. 7A, 7B, 7C, and 7D are partial sectional views depicting schematically part of the manufacturing process of the organic EL element according to the embodiment, wherein FIG. 7A depicts a state in which an intermediate layer is formed on the light-emitting layers and the partition wall layers, FIG. 7B depicts a state in which the electron injection and transport layer is formed on the intermediate layer, FIG. 7C depicts a state in which a light-transmitting conductive layer is formed on the electron injection and transport layer, and FIG. 7D depicts a state in which a counter electrode and a sealing layer are formed on the light-transmitting conductive layer;

FIG. 8 is a flow chart showing the manufacturing process of the organic EL element according to the embodiment.

DETAILED DESCRIPTION OF THE PREFERRED EMBODIMENT

Figure 1:
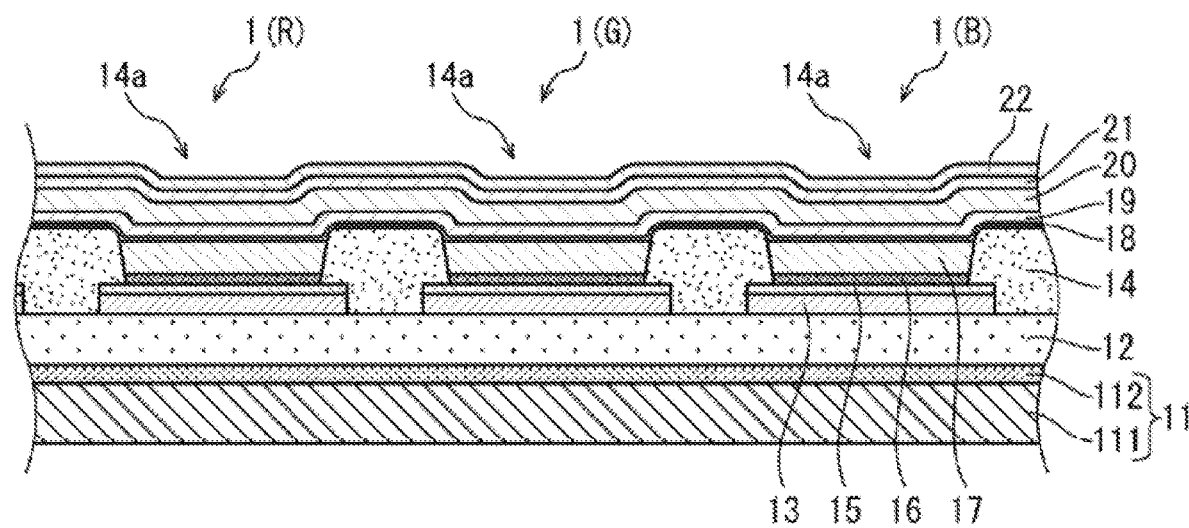
FIG. 1 is a sectional view depicting schematically the configuration of an organic EL element according to an embodiment of the present disclosure.

<How the Present Disclosure has been Reached>

In an organic EL element adopting an optical resonator structure, when it is intended to enhance light extraction efficiency by utilizing zeroth-order light interference, it is necessary that the distance between a light-transmitting electrode and a light-emitting layer be designed to be approximately 20 nm. On the other hand, if the film thickness of a functional layer is insufficient, carriers (electrons or holes) are injected insufficiently, which would cause an increase in electric power consumption of the organic EL element. In view of this, the present inventor investigated how to enhance light extraction efficiency by utilizing first-order light interference and to secure a sufficient film thickness of the functional layer.

However, it is necessary to design the distance between the light-transmitting electrode and the light emitting layer at a value of not less than approximately 150 nm in the case where it is intended to enhance light extraction efficiency by utilizing first-order light interference which is the highest in light extraction efficiency after zeroth-order light interference, as above-mentioned. On the other hand, if the light-emitting layer or the functional layer is thickened in excess of an appropriate film thickness range, it causes an increase in the driving voltage for the organic EL element or a lowering in light extraction efficiency, leading to an increase in electric power consumption. For example, when the light-emitting layer is thickened, resistance increases, resulting in an increase in electric power consumption. In addition, in the case where the light-transmitting electrode is the cathode, an electron injection layer and an electron transport layer are interposed between the light-emitting layer and the light-transmitting electrode, and thickening of these layers causes a lowering in light extraction efficiency. In general, these functional layers are often formed by doping with a metal for enhancing electron-injecting property, and, particularly, an alkali metal or an alkaline earth metal is used as a dopant because of a low work function thereof. On the other hand, alkali metals and alkaline earth metals have a property of absorbing visible light. Therefore, thickening of a functional layer having an electron-injecting property lowers light transmittance, leading to a lowering in light extraction efficiency.

In view of the foregoing, the present inventor made investigation on a method for adopting an optical resonator structure while maintaining the film thicknesses of the light-emitting layer and the functional layers at appropriate levels, and has arrived at an idea of providing a light-transmitting conductive layer between the functional layer and the light-transmitting electrode.

<Modes of Disclosure>

In accordance with one mode of the present disclosure, there is provided an organic EL element including: an anode; a light-emitting layer disposed over the anode; a functional layer disposed on the light-emitting layer in contact with the light-emitting layer and including a first metal; a light-transmitting conductive layer disposed on the functional layer in contact with the functional layer and composed of a metallic oxide; and a cathode disposed on the light-transmitting conductive layer in contact with the light-transmitting conductive layer and composed of a metal, wherein the functional layer has a film thickness of 15 to 35 nm, and a surface of the anode on the light-emitting layer side and an interface between the cathode and the light-transmitting conductive layer are spaced from each other by not less than 150 nm.

In accordance with another mode of the present disclosure, there is provided an organic EL element including: an anode; a light-emitting layer disposed over the anode; a functional layer disposed on the light-emitting layer and including a first metal; an intermediate layer disposed between the light-emitting layer and the functional layer in contact with the light-emitting layer and the functional layer, the intermediate layer including a fluoride of a second metal, the second metal being an alkali metal or an alkaline earth metal; a light-transmitting conductive layer disposed on the functional layer in contact with the functional layer and composed of a metallic oxide; and a cathode disposed on the light-transmitting conductive layer in contact with the light-transmitting conductive layer and composed of a metal, wherein the functional layer has a film thickness of 15 to 35 nm, and a surface of the anode on the light-emitting layer side and an interface between the cathode and the light-transmitting conductive layer are spaced from each other by not less than 150 nm.

In the organic EL element as above, the functional layers and optionally the intermediate layer (hereinafter the functional layers and the intermediate layer will be collectively referred to as "the functional layers and the like") and the light-transmitting conductive layer are interposed between the light-emitting layer and the cathode. Therefore, it is possible to render the film thicknesses of the light-emitting layer and the functional layers and the like appropriate and thereby to reduce electric power consumption. In addition, with the film thickness of the light-transmitting conductive layer enlarged without enlarging the film thicknesses of the functional layers and the like more than necessary, it is possible to restrain attenuation of light between the light emitting layer and the cathode and to set the distance between the light-emitting layer and the cathode to a distance which is sufficient for extracting light by utilizing the first-order light interference. In other words, the first-order light interference can be utilized without rendering the film thicknesses of the light-emitting layer and the functional layers and the like excessively large, and, accordingly, it becomes possible to lower the driving voltage and to enhance the light extraction efficiency.

In accordance with a further mode of the present disclosure, there is provided a method of manufacturing an organic EL element, the method including: forming an anode; forming a light-emitting layer over the anode; forming a functional layer on the light-emitting layer in contact with the light-emitting layer, the functional layer including a metallic material; forming a light-transmitting conductive layer on the functional layer in contact with the functional layer, the light-transmitting conductive layer composed of a metallic oxide; and forming a cathode on the light-transmitting conductive layer in contact with the light-transmitting conductive layer, the cathode composed of a metal, wherein the functional layer is formed such as to have a film thickness of 15 to 35 nm, and the light-transmitting conductive layer is formed such that a surface of the anode on the light-emitting layer side and an interface between the cathode and the light-transmitting conductive layer are spaced from each other by not less than 150 nm.

In accordance with a still further mode of the present disclosure, there is provided a method of manufacturing an organic EL element, the method including: forming an anode; forming a light-emitting layer over the anode; forming an intermediate layer on the light-emitting layer in contact with the light-emitting layer; forming a functional layer on the intermediate layer in contact with the intermediate layer, the functional layer including a metallic material; forming a light-transmitting conductive layer on the functional layer in contact with the functional layer, the light-transmitting conductive layer composed of a metallic oxide; and forming a cathode on the light-transmitting conductive layer in contact with the light-transmitting conductive layer, the cathode composed of a metal, wherein the intermediate layer is formed such as to include a fluoride of a second metal, the second metal being an alkali metal or an alkaline earth metal, the functional layer is formed such as to have a film thickness of 15 to 35 nm, and the light-transmitting conductive layer is formed such that a surface of the anode on the light-emitting layer side and an interface between the cathode and the light-transmitting conductive layer are spaced from each other by not less than 150 nm.

In the organic EL element manufactured by the manufacturing methods as above, also, the same or similar effects to the above-mentioned can be obtained.

In the organic EL elements and the manufacturing methods according to the described modes, the following configuration may be adopted.

In a configuration which may be adopted, the functional layer is composed of an electron-transporting organic material and is doped with the first metal.

By this configuration, the electron-supplying property from the functional layer to the light-emitting layer is rendered favorable, since the functional layer has an electron-injecting property and a high electron-transporting property. This contributes to a reduction in electric power consumption through a lowering in the driving voltage.

A configuration may be adopted wherein the first metal is selected from alkali metals and alkaline earth metals.

In addition, a configuration may be adopted wherein the concentration of the first metal in the functional layer is 5% to 40% by weight.

Besides, a configuration may be adopted wherein the first metal is barium or lithium.

By this, it is ensured that the functional layer has a low work function, and the electron-injecting property is further enhanced, which contributes to a reduction in electric power consumption through a lowering in the driving voltage.

In addition, a configuration may be adopted wherein the second metal is sodium.

By this, the electron-injecting property into the light-emitting layer by the intermediate layer is further enhanced, which contributes to a reduction in electric power consumption through a lowering in the driving voltage.

In addition, a configuration may be adopted wherein the light-transmitting conductive layer is composed of ITO (indium tin oxide) or IZO (indium zinc oxide).

This ensures that since the light-transmitting conductive layer is good in conductivity and light transmittance, this layer is suitable for restraining an increase in electric power consumption and for enhancing light extraction efficiency of the optical resonator structure.

Besides, a configuration may be adopted wherein the surface of the anode on the light-emitting layer side and the interface between the cathode and the light-transmitting conductive layer form a resonator structure.

This makes it possible to utilize first-order light interference of the resonator structure and to enhance light extraction efficiency.

Embodiments

An organic EL element according to an embodiment of the present disclosure will be described below. The following description is merely an example for explaining the configuration as well as the operation and effect of a mode for carrying out the present disclosure, and other points than the essential part of the present disclosure are not limited to or by the following description.

1. Configuration of Organic EL Element

FIG. 1 is a partial sectional view of an organic EL display panel 100 (see FIG. 9) according to Embodiment 1. The organic EL display panel 100 includes a plurality of pixels each composed of organic EL elements 1(R), 1(G) and 1(B) for emitting light in three colors (red, green and blue), respectively. FIG. 1 depicts a section of one of the pixels.

In the organic EL display panel 100, each organic EL element 1 is of the so-called top emission type wherein light is emitted forward (toward the upper side in FIG. 1).

Since the organic EL element 1(R), the organic EL element 1(G) and the organic EL element 1(B) have substantially the same configuration, they will be described as the organic EL element 1 when not discriminated from one another.

As depicted in FIG. 1, the organic EL element 1 includes a substrate 11, an interlayer insulating layer 12, a pixel electrode 13, a partition wall layer 14, a hole injection layer 15, a hole transport layer 16, a light-emitting layer 17, an intermediate layer 18, an electron injection and transport layer 19, a light-transmitting conductive layer 20, a counter electrode 21, and a sealing layer 22. The electron injection and transport layer 19 corresponds to the functional layer in the present disclosure. In addition, the intermediate layer 18 corresponds to the intermediate layer in the present disclosure. Note that each of the substrate 11, the interlayer insulating layer 12, the intermediate layer 18, the electron injection and transport layer 19, the light-transmitting conductive layer 20, the counter electrode 21, and the sealing layer 22 is not formed on a pixel basis but formed in common for a plurality of organic EL elements 1 possessed by the organic EL display panel 100.

<Substrate>

The substrate 11 includes a base material 111 which is an insulating material, and a TFT layer 112. In the TFT layer 112, driving circuits are formed on a pixel basis. Examples of the substrates which can be used as the base material 111 include a glass substrate, a quartz substrate, a silicon substrate, a molybdenum sulfide substrate, metallic substrates such as those of copper, zinc, aluminum, stainless steel, magnesium, iron, nickel, gold, silver, etc., semiconductor substrates such as gallium-arsenic substrate, etc., a plastic substrate, and the like. The plastic material may be either of thermoplastic resin and thermosetting resin. Examples of the plastic material include polyethylene, polypropylene, polyamides, PI (polyimides), polycarbonates, acrylic resins, PET (polyethylene terephthalate), polybutylene terephthalate, polyacetal, fluororesins, various thermoplastic elastomers based on styrene, polyolefin, polyvinyl chloride, polyurethane, fluoro-rubber, chlorinated polyethylene or the like, epoxy resins, unsaturated polyesters, silicone resins, polyurethane, etc., and copolymers, blends, polymer alloys and the like containing these as main constituents, which may be used either singly or as a laminate of one or more of them.

<Interlayer Insulating Layer>

The interlayer insulating layer 12 is formed on the substrate 11. The interlayer insulating layer 12 is formed from a resin material, and is for flattening (planarizing) steps present on the upper side of the TFT layer 112. Examples of the resin material include positive-type photosensitive materials. Examples of the photosensitive materials include those based on acrylic resin, polyimide resin, siloxane resin, or phenolic resin. In addition, though not illustrated in the sectional view in FIG. 1, the interlayer insulating layer 12 is formed with contact holes on a pixel basis.

<Pixel Electrode>

The pixel electrode 13 includes a metallic layer composed of a light-reflecting metallic material, and is formed on the interlayer insulating layer 12. The pixel electrodes 13 are provided on a pixel basis, and are each electrically connected to the TFT layer 112 through the contact hole.

In the present embodiment, the pixel electrode 13 functions as an anode.

Examples of the light-reflecting metallic material include Ag (silver), Al (aluminum), aluminum alloys, Mo (molybdenum), APC (an alloy of silver, palladium and copper), ARA (an alloy of silver, rubidium and gold), MoCr (an alloy of molybdenum and chromium), MoW (an alloy of molybdenum and tungsten), and NiCr (an alloy of nickel and chromium).

The pixel electrode 13 may be configured as a single metallic layer, but may also have a stack structure wherein a layer of a metallic oxide such as ITO (indium tin oxide) or IZO (indium zinc oxide) is stacked on a metallic layer.

<Partition Wall Layer>

The partition wall layer 14 is formed on the hole injection layers 15 in such a state that partial regions on the upper side of the pixel electrodes 13 and the hole injection layers 15 are exposed whereas the surrounding regions are covered. Those regions (hereinafter referred to as "openings") on the upper side of the hole injection layer 15 which are not covered with the partition wall layer 14 correspond to respective sub-pixels. In other words, the partition wall layer 14 has the openings 14a provided on a sub-pixel basis.

In the present embodiment, the partition wall layer 14 is formed on the interlayer insulating layer 12 in areas where the pixel electrode 13 is not formed. In other words, in areas where the pixel electrode 13 is not formed, a bottom surface of the partition wall layer 14 is in contact with an upper surface of the interlayer insulating layer 12.

The partition wall layer 14 is composed, for example, of an insulating organic material (e.g., acrylic resin, polyimide resin, novolak resin, or phenolic resin). In the case where the light-emitting layer 17 is formed by a coating method, the partition wall layer 14 functions as a structure for preventing the applied ink from flowing over to outside. In the case where the light-emitting layer 17 is formed by a vapor deposition method, the partition wall layer 14 functions as a structure on which to place a vapor deposition mask. In the present embodiment, the partition wall layer 14 is composed of a resin material. Examples of the material for the partition wall layer 14 include acrylic resins, polyimide resins, siloxane resins, and phenolic resins. In the present embodiment, a phenolic resin is used.

<Hole Injection Layer>

The hole injection layer 15 is provided on the pixel electrode 13 for the purpose of accelerating injection of holes from the pixel electrode 13 into the light-emitting layer 17. The hole injection layer 15 is a layer composed of, for example, an oxide of Ag (silver), Mo (molybdenum), Cr (chromium), V (vanadium), W (tungsten), Ni (nickel), Ir (iridium) or the like, or a conductive polymer material such as PEDOT (a mixture of polythiophene and polystyrenesulfonic acid). Of these examples of hole injection layer 15, the hole injection layers 15 composed of a metallic oxide have a function of injecting holes into the light-emitting layer 17 stably or while assisting the generation of holes, and have a great work function. In the present embodiment, the hole injection layer 15 is composed of tungsten oxide. When the hole injection layer 15 is formed from an oxide of a transition metal, it can take a plurality of oxidation numbers and, hence, a plurality of levels, which results in easier hole injection and contributes to a lowering in driving voltage.

<Hole Transport Layer>

The hole transport layer 16 is formed from a high-molecular compound having no hydrophilic group, in the openings 14a. For example, those high-molecular compounds such as polyolefines and derivatives thereof or polyarylamines and derivatives thereof which do not have any hydrophilic group can be used.

The hole transport layer 16 has a function of transporting holes, injected from the hole injection layer 15, to the light-emitting layer 17.

<Light-Emitting Layer>

The light-emitting layers 17 are formed in the openings 14a. The light-emitting layers 17 have a function of emitting light in respective R, G and B colors through recombination between holes and electrons. As a material for forming the light-emitting layer 17, known materials can be used.

Specifically, the light-emitting layer 17 is preferably formed from a fluorescent material such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metal, oxine metal complexes, and rare earth complexes, which are described in patent publication (Japanese Patent Laid-open No. 1993-163488).

<Intermediate Layer>

The intermediate layer 18 is formed on the light-emitting layer 17, and includes a fluoride of a metallic material that has an electron-injecting property. The metallic material is selected from alkali metals and alkaline earth metals. Specific examples of the alkali metals include Li (lithium), Na (sodium), K (potassium), Rb (rubidium), Cs (cesium), and Fr (francium). Specific examples of the alkaline earth metals include Ca (calcium), Sr (strontium), Ba (barium), and Ra (radium). In the present embodiment, Na is selected as the metallic material.

<Electron Injection and Transport Layer>

The electron injection and transport layer 19 is formed on the intermediate layer 18, and is composed of an electron-transporting organic material doped with a metallic material for enhancing an electron-injecting property. The metallic material is preferably selected from alkali metals or alkaline earth metals, and is more preferably Ba or Li. In the present embodiment, Ba is selected as the metallic material here. The electron injection and transport layer 19 is preferably doped with the metallic material in an amount 5% to 40% by weight. In the present embodiment, the doping amount is 20% by weight.

Examples of the electron-transporting organic material include π-electron low-molecular organic materials such as OXD (oxadiazole derivatives), TAZ (triazole derivatives), and BCP, Bphen (phenanthroline derivatives).

<Light-Transmitting Conductive Layer>

The light-transmitting conductive layer 20 is formed on the electron injection and transport layer 19. The light-transmitting conductive layer 20 is preferably higher than the electron injection and transport layer 19 in transmittance of light emitted from the light-emitting layer 17. As a material for the light-transmitting conductive layer 20, there can be used, for example, ITO, IZO and the like. In the present embodiment, ITO is used.

Note that an interface between the counter electrode 21 and the light-transmitting conductive layer 20 serves for forming a resonator structure. Therefore, the refractive index of the light-transmitting conductive layer 20 is preferably close to the refractive index of the electron injection and transport layer 19, and is preferably different from the refractive index of the counter electrode 21.

<Counter Electrode>

The counter electrode 21 is composed of a light-transmitting conductive material, and is formed on the light-transmitting conductive layer 20. In the present embodiment, the counter electrode 21 functions as a cathode.

An interface between the counter electrode 21 and the light-transmitting conductive layer 20 forms a resonator structure, in pair with the interface between the pixel electrode 13 and the hole injection layer 15. Therefore, when the light emitted from the light-emitting layer 17 goes through the light-transmitting conductive layer 20 to enter the counter electrode 21, it is necessary for part of the light to be reflected to the light-transmitting conductive layer 20. Therefore, it is preferable that the counter electrode 21 and the light-transmitting conductive layer 20 differ from each other in refractive index. Accordingly, the counter electrode 21 is preferably a metallic thin film.

Examples of the material of the counter electrode 21 include thin films of Ag (silver), Al (aluminum), silver alloys, and aluminum alloys. Examples of the silver alloys include magnesium-silver alloys and indium-silver alloys. Besides, examples of the aluminum alloys include magnesium-aluminum alloys and lithium-aluminum alloys.

<Sealing Layer>

The sealing layer 22 has a function of restraining the organic layers such as the light-emitting layer 17, the intermediate layer 18, and the electron injection and transport layer 19 from being exposed to moisture or being exposed to air, and is formed from a light-transmitting material such as SiN (silicon nitride) or SiON (silicon oxynitride), for example. In addition, a sealing resin layer composed of an acrylic resin, a silicone resin or the like may be provided on a layer formed by use of such a material as SiN (silicon nitride) or SiON (silicon oxynitride).

In the present embodiment, the organic EL display panel 100 is of the top emission type, and, therefore, it is necessary for the sealing layer 22 to be formed from a light-transmitting material.

<Others>

Note that though not illustrated in FIG. 1, color filters and an upper substrate may be laminated over the sealing layer 22, through a sealing resin therebetween. With the upper substrate thus laminated, it is possible to protect the hole transport layer 16, the light-emitting layer 17, the intermediate layer 18, and the electron injection and transport layer 19 from moisture, air and the like.

2. Optical Resonator Structure

Figure 2:
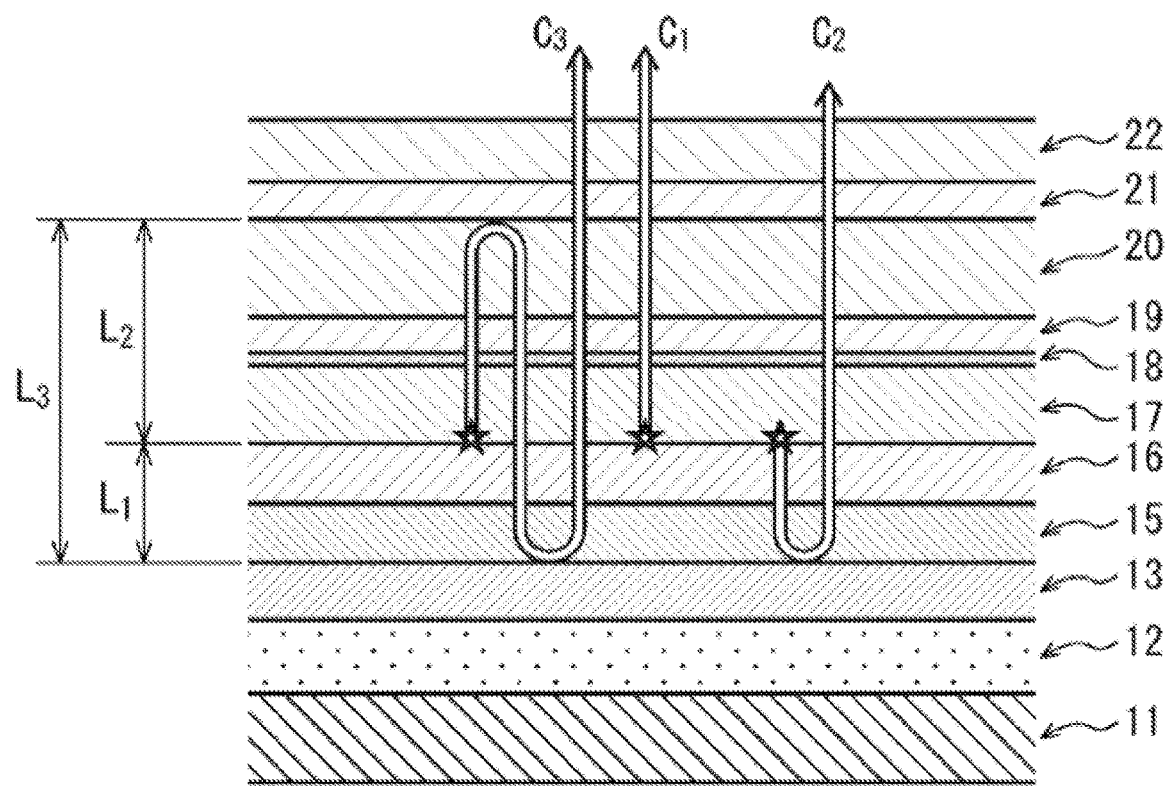
FIG. 2 is an illustration of interferences of light in an optical resonator structure formed in the organic EL element.

FIG. 2 depicts interferences of light in the optical resonator structure of the organic EL element 1 according to the present embodiment. The optical resonator structure is configured between the interface between the pixel electrode 13 and the hole injection layer 15 and the interface between the counter electrode 21 and the light-transmitting conductive layer 20. Thus, the light-emitting layer 17 is present inside the resonator structure.

FIG. 2 depicts main paths of the light emitted from the light-emitting layer 17. A path C1 is a path along which the light emitting from the light-emitting layer 17 toward the counter electrode 21 side is transmitted through the counter electrode 21 without being reflected. A path C2 is a path along which the light emitting from the light-emitting layer 17 toward the pixel electrode 13 side is reflected by the pixel electrode 13 and is transmitted through the light-emitting layer 17 and the counter electrode 21. A path C3 is a path along which the light emitted from the light-emitting layer 17 toward the counter electrode 21 side is reflected by the counter electrode 21, is further reflected by the pixel electrode 13 and is transmitted through the light-emitting layer 17 and the counter electrode 21. Then, interference occurs between the lights emitted along the respective paths C1 to C3.

The difference in optical distance between the path C1 and the path C2 corresponds to an optical film thickness L1 depicted in FIG. 2. The optical film thickness L1 is an optical distance in total of the hole transport layer 16 and the hole injection layer 15 (a sum total of products of film thickness and refractive index for the films), ranging from the light-emitting layer 17 to the interface between the pixel electrode 13 and the hole injection layer 15.

In addition, the difference in optical distance between the path C2 and the path C3 corresponds to an optical film thickness L2 depicted in FIG. 2. The optical film thickness L2 is an optical distance of the intermediate layer 18, the electron injection and transport layer 19 and the light-transmitting conductive layer 20 (a sum total of products of film thickness and refractive index for the films), ranging from the light-emitting layer 17 to the interface between the counter electrode 21 and the light-transmitting conductive layer 20.

In addition, the difference in optical distance between the path C1 and the path C3 corresponds to an optical film thickness L3 depicted in FIG. 2. The optical film thickness L3 is the sum of the optical film thickness L1 and the optical film thickness L2.

Figure 3:
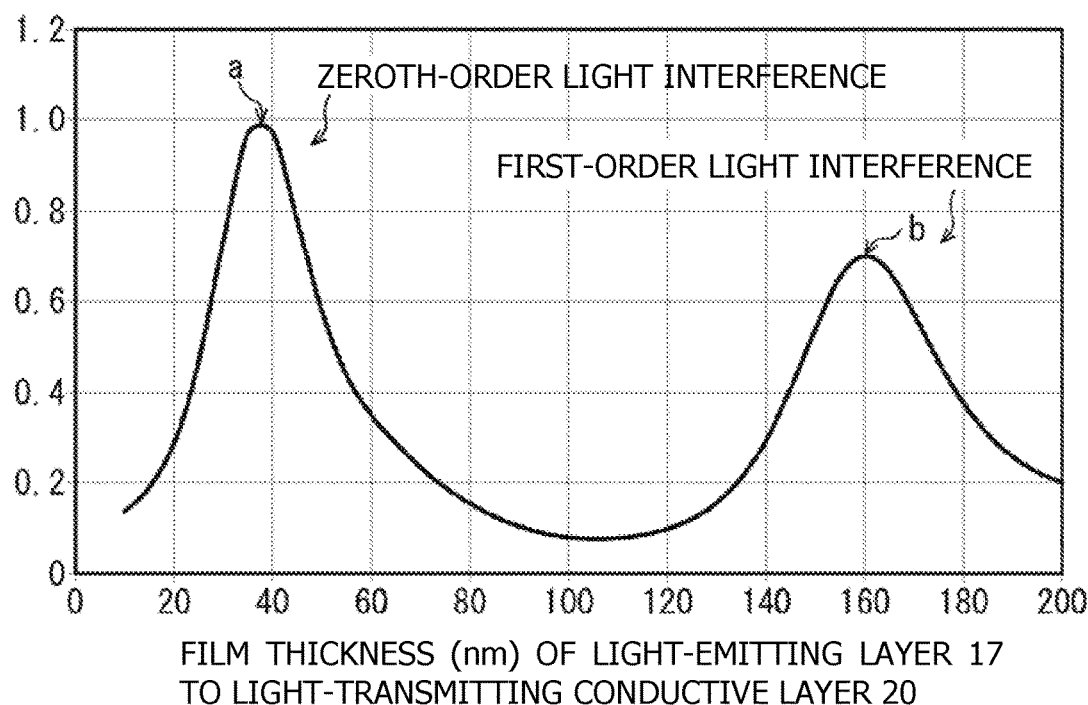
FIG. 3 is a graph depicting the relation between luminance/Y-value of light extracted from the organic EL element and a film thickness of cathode-side functional layers.

In the optical resonator structure, the optical film thicknesses L1, L2 and L3 are each set in such a manner that the lights emitted along the path C1, the path C2 and the path C3 intensify one another. In this case, in the optical film thicknesses L1, L2 and L3, as an optical film thickness at which light extraction efficiency is maximized, not only a zeroth-order light interference peak but also a first-order light interference peak is present, as depicted in a graph in FIG. 3. FIG. 3 depicts the characteristic relation between the optical film thickness and luminance/Y-value of extracted light, the luminance/Y-value being the ratio of the luminance of the light extracted from the organic EL element 1 and the Y-value in xy chromaticity of the light. In the present embodiment, the optical film thickness L2 is set at or in the vicinity of a distance corresponding to the first-order light interference peak. This is because a fact that at the optical film thickness at which the light extraction efficiency is maximized, the chromaticity of the light extracted may not necessarily be a desired chromaticity, and correction by use of color filters is needed, resulting in that the light extraction efficiency may be lowered upon passage through the color filters. Accordingly, in the present embodiment, the distance between the counter electrode 21 and the light-emitting layer 17 is not less than approximately 150 nm. Note that the size of the optical resonator structure as a whole, namely, the distance between the interface between the counter electrode 21 and the light-transmitting conductive layer 20 and the interface between the pixel electrode 13 and the hole injection layer 15 is naturally not less than 150 nm.

3. Film Thickness of Electron Injection and Transport Layer

Figure 4A:
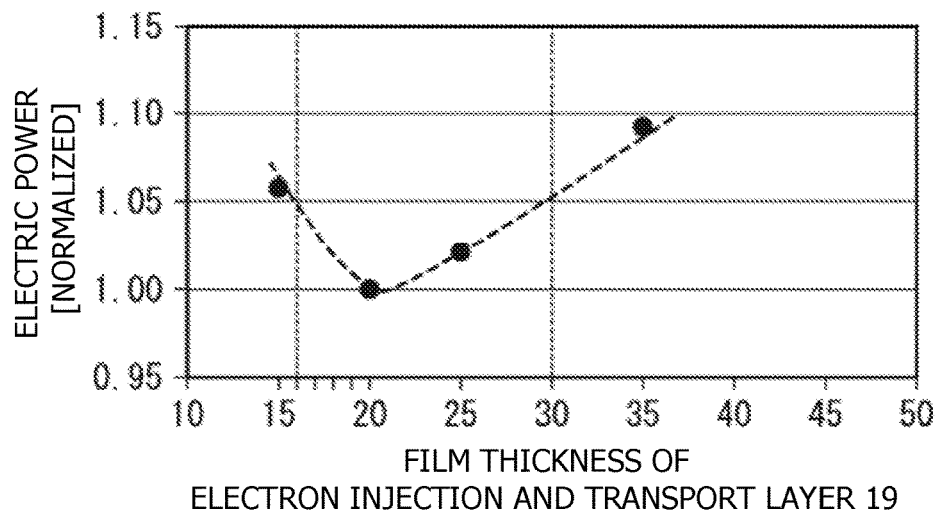
FIGS. 4A, 4B, and 4C are graphs depicting the relation between film thickness of an electron injection and transport layer and electric power consumed by the organic EL element, wherein FIG. 4A relates to a red organic EL element, FIG. 4B relates to a green organic EL element, and FIG. 4C relates to a blue organic EL element.
Figure 4B:
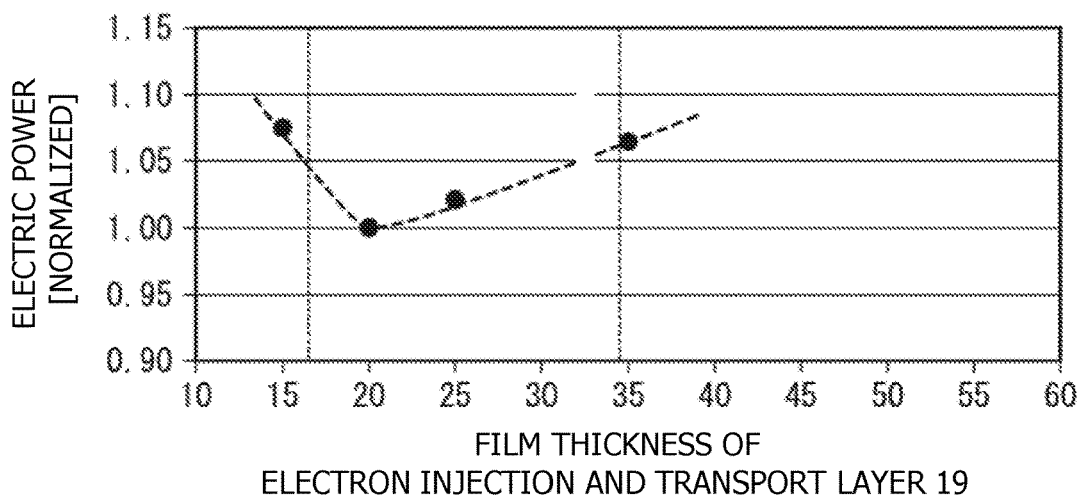
Figure 4C:
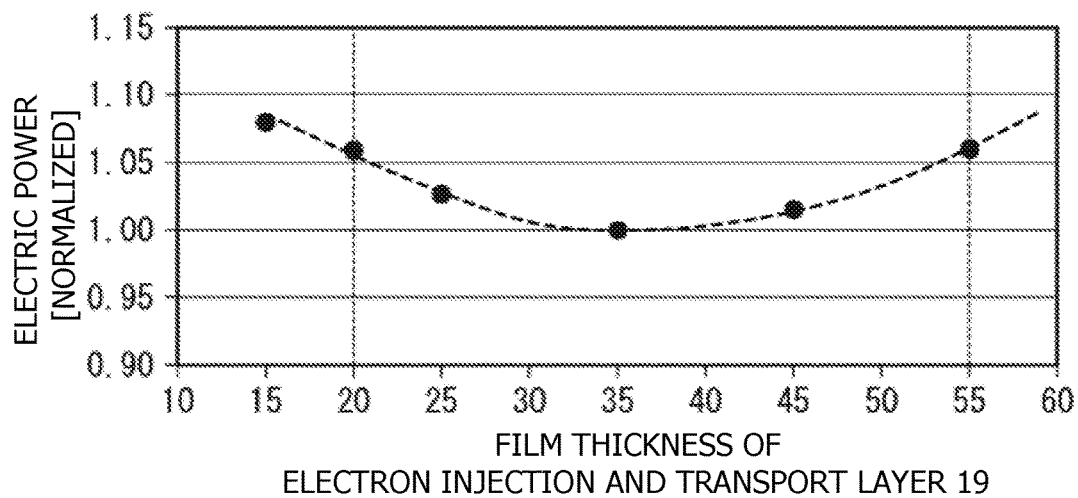

FIGS. 4A, 4B, and 4C are graphs depicting the relation between film thickness of the electron injection and transport layer 19 and electric power consumption of the organic EL element 1. Here, the metal with which the electron injection and transport layer 19 is doped is Ba (barium), and the doping concentration is 20% by weight. Note that FIG. 4A depicts the case of the organic EL element 1(R), FIG. 4B depicts the case of the organic EL element 1(G), and FIG. 4C depicts the case of the organic EL element 1(B).

In all the cases, when the film thickness of the electron injection and transport layer 19 is not less than approximately 35 nm, the electric power consumption increases as the film thickness of the electron injection and transport layer 19 increases. This is because an increase in the film thickness of the electron injection and transport layer 19 strengthens the absorption of light by barium used as dopant, resulting in a lowering in light extraction efficiency.

On the other hand, when the film thickness of the electron injection and transport layer 19 is not more than 15 nm, the electric power consumption increases as the film thickness of the electron injection and transport layer 19 decreases. This is because a decrease in the film thickness of the electron injection and transport layer 19 reduces the amount of barium, which leads to a lowering in an electron-injecting property, resulting in a rise in the driving voltage for the organic EL element 1.

Accordingly, a most preferable light emission efficiency is obtained when the film thickness of the electron injection and transport layer 19 is in the range of 15 to 35 nm for the organic EL element 1(R), in the range of 15 to 40 nm for the organic EL element 1(G), and in the range of 10 to 60 nm for the organic EL element 1(B).

Note that as above-mentioned, the electron injection and transport layer 19 is not formed on a pixel basis but is formed in common for a plurality of organic EL elements 1 possessed by the organic EL display panel 100. Therefore, the film thickness of the electron injection and transport layer 19 formed in common for the organic EL elements 1 is preferably in the range of 15 to 35 nm.

4. Film Thicknesses of Intermediate Layer and Light-Transmitting Conductive Layer The film thickness of the intermediate layer 18 is preferably such that enhancement of an electron-injecting property and a lowering in driving voltages for the organic EL elements 1 are both achieved; thus, the film thickness of the intermediate layer 18 is preferably 1 to 10 nm. If the film thickness of the intermediate layer 18 is smaller than 1 nm, the property for electron injection into the light-emitting layer 17 is not sufficiently enhanced. If the film thickness of the intermediate layer 18 is greater than 10 nm, on the other hand, the electron-injecting property is not exhibited and the driving voltage rises.

The film thickness of the light-transmitting conductive layer 20 is designed in such a manner that the optical distance of the intermediate layer 18, the electron injection and transport layer 19 and the light-transmitting conductive layer 20 becomes the set optical film thickness L2. Specifically, let the film thickness and the refractive index of the intermediate layer 18 be t1 and n1, the film thickness and the refractive index of the electron injection and transport layer 19 be t2 and n2, and the film thickness and the refractive index of the light-transmitting conductive layer 20 be t3 and n3, then the film thickness t3 of the light-transmitting conductive layer 20 is set in such a manner that $n1t1+n2t2+n3t3$ is the designed film thickness L2. Accordingly, the film thickness t3 of the light-transmitting conductive layer 20 is not less than approximately 100 nm.

5. Method of Manufacturing Organic EL Element

A method of manufacturing the organic EL element 1 will be described referring to the drawings. FIGS. 5A, 5B, 5C, 5D and 5E, FIGS. 6A, 6B, 6C, and 6D, and FIGS. 7A, 7B, 7C, and 7D are schematic sectional views depicting the states in steps in the manufacture of the organic EL element 1.

(1) Formation of Substrate 11

Figure 5A:
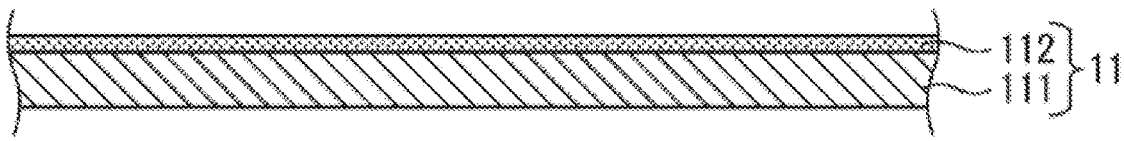

First, as depicted in FIG. 5A, a TFT layer 112 is formed on a base material 111 to form a substrate 11 (step S1 in FIG. 8). The TFT layer 112 can be formed by a known TFT fabricating method.

Figure 5B:
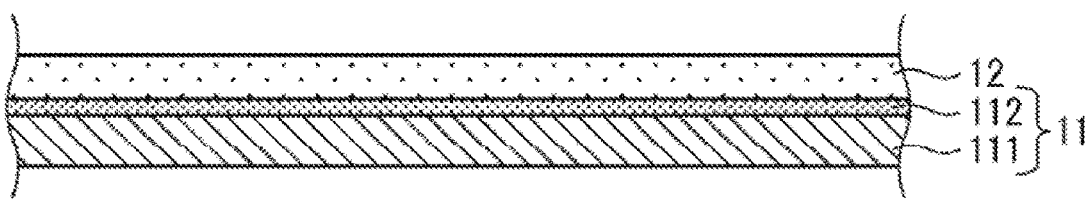

Next, as depicted in FIG. 5B, an interlayer insulating layer 12 is formed on the substrate 11 (step S2 in FIG. 8). The interlayer insulating layer 12 can be stackedly formed by use of, for example, plasma CVD (chemical vapor deposition), sputtering or the like.

Subsequently, contact holes are formed at those parts of the interlayer insulating layer 12 which are located over source electrodes of the TFT layer 112 by dry etching. The contact holes are each formed such that a surface of the source electrode is exposed at a bottom portion thereof.

Next, a connection electrode layer is formed along an inside wall of each contact hole. Part of an upper portion of the connection electrode layer is disposed on the interlayer insulating layer 12. The connection electrode layer can be formed by, for example, sputtering, and after a metallic film is formed, patterning is conducted by photolithography and wet etching.

(2) Formation of Pixel Electrodes 13 and Hole Injection Layers 15

Figure 5C:
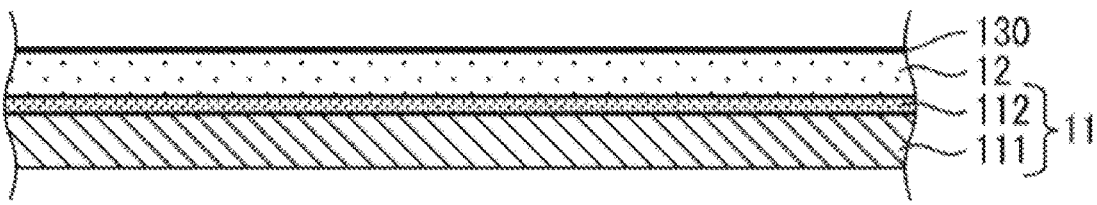

Subsequently, as depicted in FIG. 5C, a pixel electrode material layer 130 is formed on the interlayer insulating layer 12 (step S3 in FIG. 8). The pixel electrode material layer 130 can be formed by, for example, vacuum deposition, sputtering or the like.

Figure 5D:
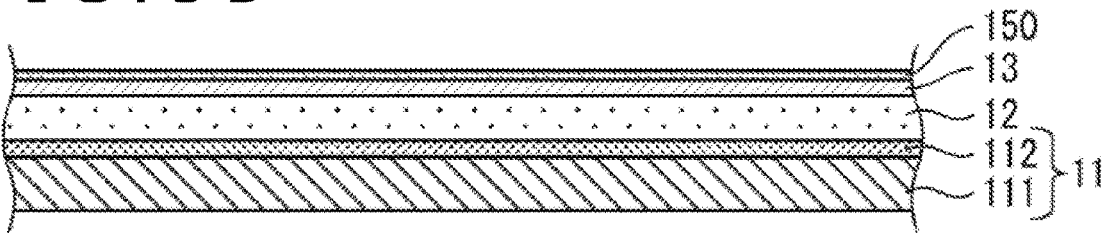

Next, as depicted in FIG. 5D, a hole injection material layer 150 is formed on the pixel electrode material layer 130 (step S4 in FIG. 8). The hole injection material layer 150 can be formed by, for example, reactive sputtering or the like.

Figure 5E:
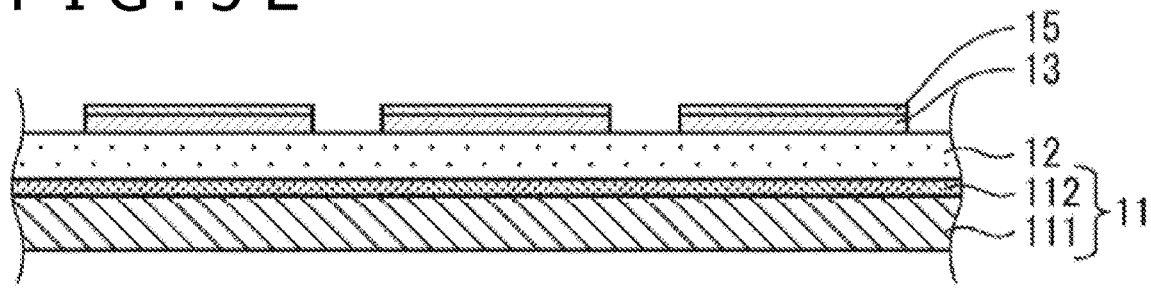

Then, as depicted in FIG. 5E, the pixel electrode material layer 130 and the hole injection material layer 150 are patterned by etching, to form pluralities of pixel electrodes 13 and hole injection layers 15 partitioned on a sub-pixel basis (step S5 in FIG. 8).

Note that the method of forming the pixel electrodes 13 and the hole injection layers 15 is not limited to the above-mentioned; for example, the pixel electrode material layer 130 may be patterned to form the pixel electrodes 13, and thereafter the hole injection layers 15 may be formed.

(3) Formation of Partition Wall Layers 14

Figure 6A:
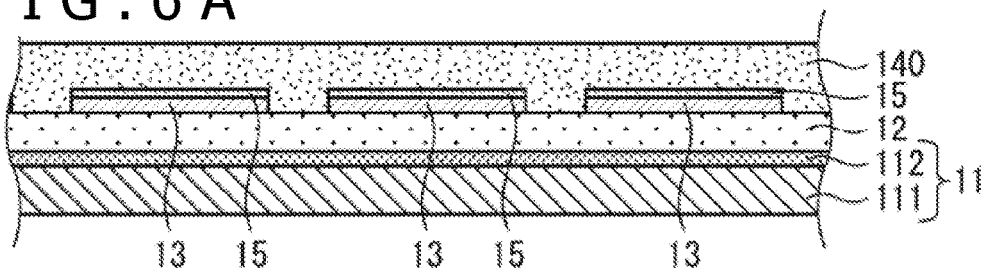
Figure 6B:
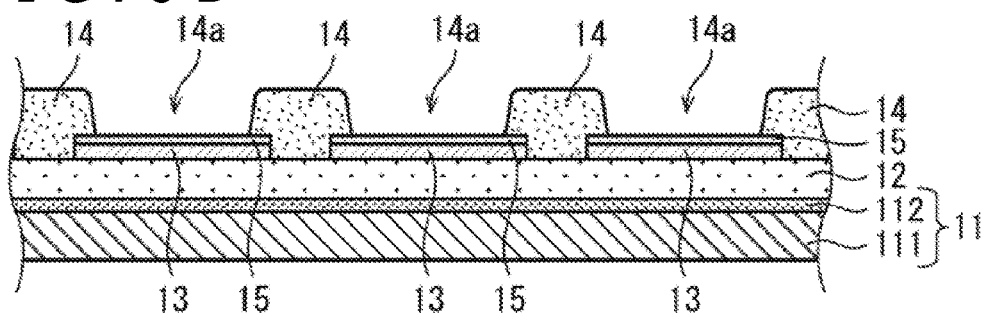

Subsequently, as depicted in FIG. 6A, a partition wall layer resin as a material for a partition wall layer 14 is applied to the hole injection layers 15 and the interlayer insulating layer 12, to form a partition wall material layer 140. The partition wall material layer 140 is formed by a method wherein a solution obtained by dissolving a phenolic resin as the partition wall layer resin in a solvent (for example, a mixed solvent of ethyl lactate and GBL (gamma-butyrolactone)) is uniformly applied onto the hole injection layers 15 and the interlayer insulating layer 12 by spin coating or the like. Then, the partition wall material layer 140 is subjected to pattern exposure and development to form the partition wall layers 14 (FIG. 6B, step S6 in FIG. 8), and the partition wall layers 14 are baked (step S7 in FIG. 8). By this, openings 14a as formation regions of light-emitting layers 17 are defined. The baking of the partition wall layers 14 is conducted, for example, at a temperature of 150° C. to 210° C. for 60 minutes.

In addition, in the step of forming the partition wall layers 14, the surfaces of the partition wall layers 14 may be surface treated with a predetermined alkaline solution, water, organic solvent or the like or may be subjected to a plasma treatment. This is performed for the purpose of controlling the contact angle of the partition wall layers 14 to an ink (solution) applied to the openings 14a or for the purpose of imparting water repellency to the surfaces.

(4) Formation of Hole Transport Layers 16

Figure 6C:
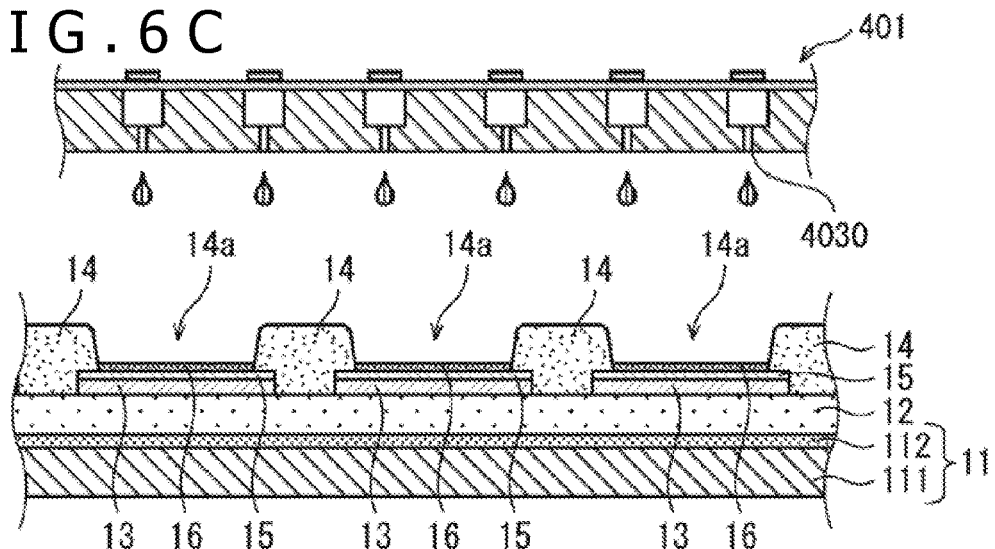

Next, as depicted in FIG. 6C, an ink containing a constituent material of hole transport layers 16 is applied to the openings 14a defined by the partition wall layers 14, by jetting the ink from nozzles 4030 of an ink jet head 401 onto the hole injection layers 15 in the openings 14a, followed by baking (drying) the ink to form the hole transport layers 16 (step S8 in FIG. 8).

(5) Formation of Light-Emitting Layers 17

Figure 6D:
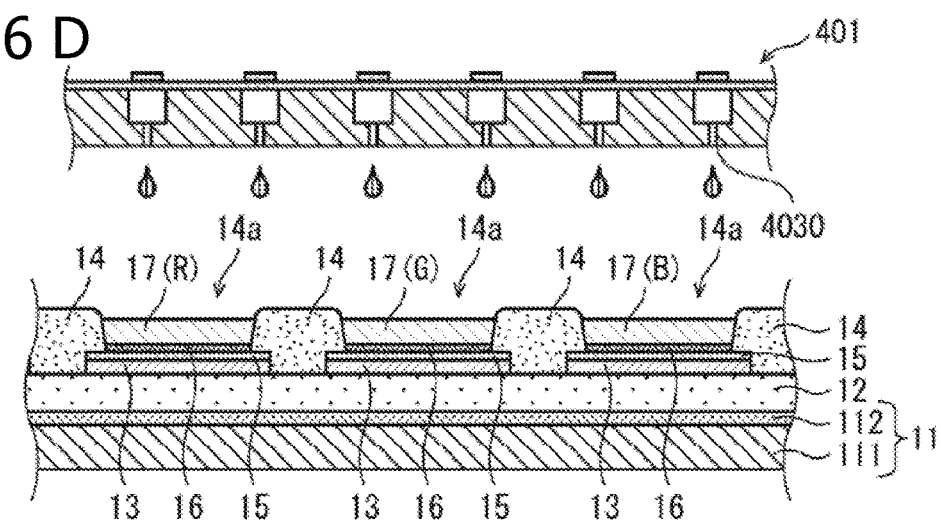

Subsequently, as depicted in FIG. 6D, an ink containing a constituent material of light-emitting layers 17 is applied onto the hole transport layers 16 in the openings 14a, by jetting the ink from the nozzles 4030 of the ink jet head 401, followed by baking (drying) to form the light-emitting layers 17 (step S9 in FIG. 8).

(6) Formation of Intermediate Layer 18

Figure 7A:
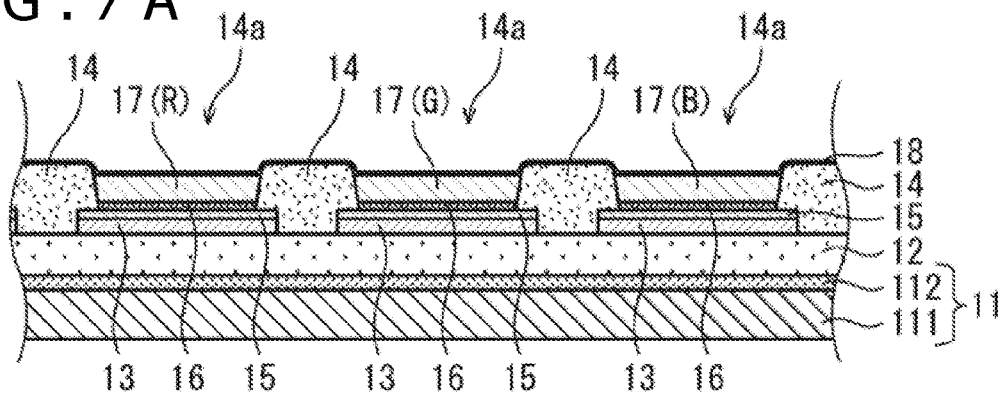

Next, as depicted in FIG. 7A, an intermediate layer 18 is formed on the light-emitting layers 17 and the partition wall layers 14 (step S10 in FIG. 8). The intermediate layer 18 is formed, for example, by forming a film of NaF, which is a fluoride of an alkali metal, in common for sub-pixels by vacuum deposition.

(7) Formation of Electron Injection and Transport Layer 19

Figure 7B:
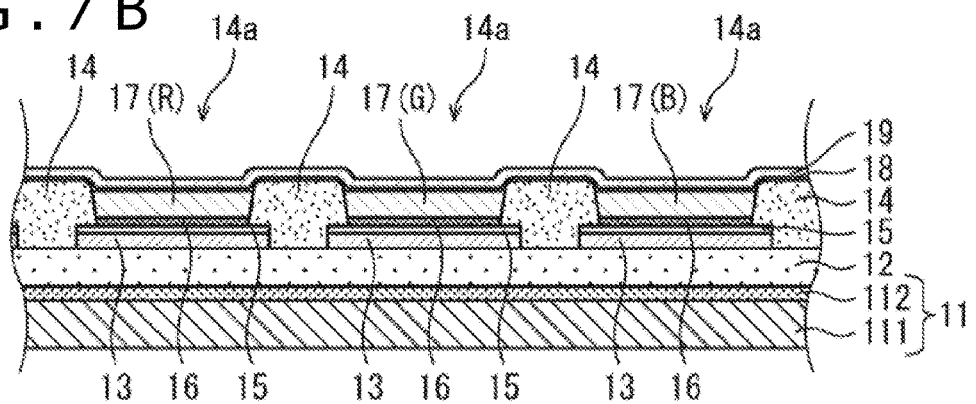

Subsequently, as depicted in FIG. 7B, an electron injection and transport layer 19 is formed on the intermediate layer 18 (step S11 in FIG. 8). The electron injection and transport layer 19 is formed, for example, by forming a film by co-evaporation of an electron-transporting organic material and a dopant metal in common for the sub-pixels.

(8) Formation of Light-Transmitting Conductive Layer 20

Figure 7C:
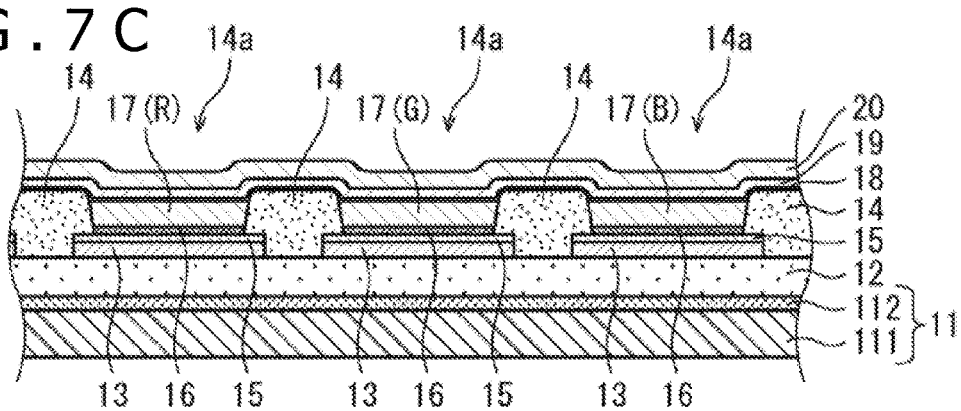

Next, as depicted in FIG. 7C, a light-transmitting conductive layer 20 is formed on the electron injection and transport layer 19 (step S12 in FIG. 8). The light-transmitting conductive layer 20 is formed by forming a film of ITO or IZO by sputtering or vacuum deposition.

(9) Formation of Counter Electrode 21

Figure 7D:
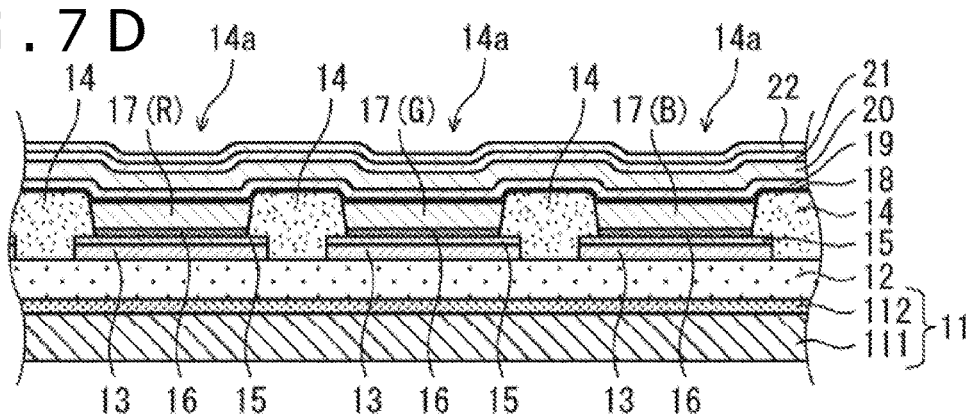

Subsequently, as depicted in FIG. 7D, a counter electrode 21 is formed on the light-transmitting conductive layer 20 (step S13 in FIG. 8). The counter electrode 21 is formed by forming a film of a metallic material by sputtering or vacuum deposition.

(10) Formation of Sealing Layer 22

Next, as depicted in FIG. 7D, a sealing layer 22 is formed on the counter electrode 21 (step S14 in FIG. 8). The sealing layer 22 can be formed by sputtering, CVD or the like.

Note that color filters or an upper substrate may be placed on and bonded to the sealing layer 22.

6. General Configuration of Organic EL Display Apparatus

Figure 9:
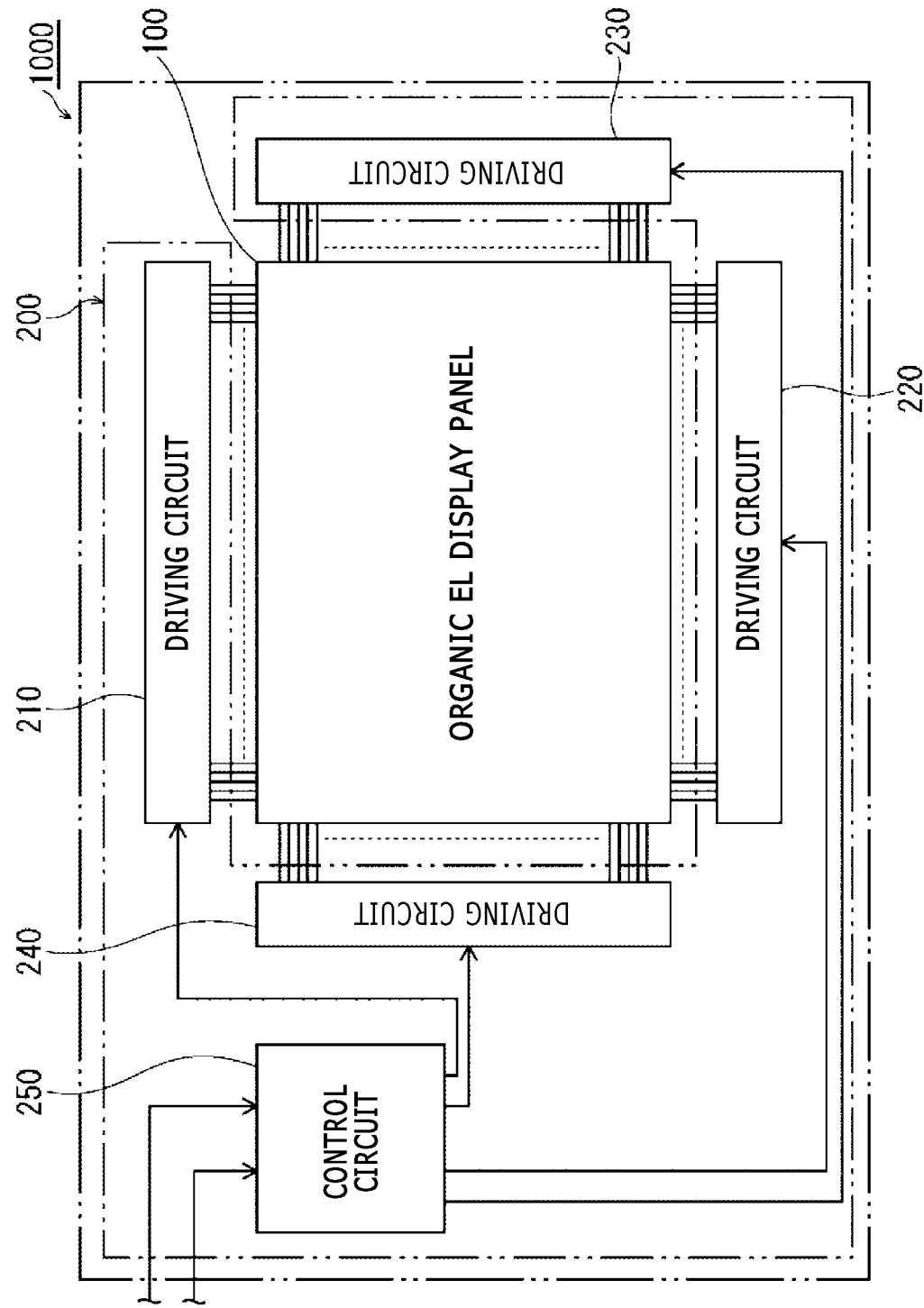
FIG. 9 is a block diagram depicting the configuration of an organic EL display apparatus including the organic EL element according to the embodiment.

FIG. 9 is a schematic block diagram depicting the configuration of an organic EL display apparatus 1000 having the organic EL display panel 100. As depicted in FIG. 9, the organic EL display apparatus 1000 includes the organic EL display panel 100, and a driving control section 200 connected thereto. The driving control section 200 includes four driving circuits 210 to 240 and a control circuit 250.

Note that in the actual organic EL display apparatus 1000, the layout of the driving control section 200 in relation to the organic EL display panel 100 is not limited to the illustrated one.

7. Modifications

While a case where a light-emitting panel according to the present disclosure is applied to an organic EL display apparatus as an example has been described in the above embodiment, this is not restrictive of the present disclosure. The light-emitting panel according to the present disclosure may be a light-emitting panel in which an inorganic light-emitting material is used.

In addition, in the embodiment above, the organic EL display apparatus is of the top emission type in which the cathode is the counter electrode. However, the present disclosure may be applied, for example, to an organic EL display apparatus of the bottom emission type in which the anode is the counter electrode. In that case, a light-transmitting conductive layer, an electron injection and transport layer, and a light-emitting layer are stacked in this order over a pixel electrode which is the cathode. Besides, the present disclosure may also be applied, for example, to the case of designing the optical film thickness L1 in FIG. 2 for the purpose of utilizing first-order light interference, in a top emission type organic EL display apparatus in which an anode is a counter electrode, or a bottom emission type organic EL display apparatus in which a cathode is a counter electrode.

In addition, while the intermediate layer 18, the hole injection layer 15 and the hole transport layer 16 have been indispensable components in the above embodiment, this is not limitative of the present disclosure. For example, there may also be adopted an organic EL element that has no intermediate layer 18, and an organic EL element that has no hole transport layer 16. Besides, for example, the hole injection layer 15 and the hole transport layer 16 may be replaced by a single hole injection and transport layer.

In addition, the display apparatus is not restrictive, and a panel-type illumination apparatus such as an organic EL illumination apparatus may be adopted.

While the organic light-emitting panel and display apparatus according to the present disclosure have been described based on the embodiment and modifications above, the present disclosure is not limited to the above embodiment and modifications. Those modes which can be obtained by applying various modifications conceived by those skilled in the art to the above embodiment and modifications, and those modes which can be realized by arbitrarily combining the component elements and functions in the above embodiment and modifications without departing from the gist of the present disclosure are also embraced by the present disclosure.

The present disclosure is useful in manufacturing a light-emitting element which has an optical resonator structure and in which light extraction efficiency is high and electric power consumption is small.

What is claimed is:

1. An organic electroluminescence element, comprising:
   an anode;
   a hole injection layer disposed on the anode;
   a partition wall layer disposed on a region of the hole injection layer;
   a light-emitting layer disposed over the hole injection layer, wherein the light-emitting layer is in contact with the partition wall layer;
   a functional layer disposed on the light-emitting layer and including a first metal;
   an intermediate layer disposed between the light-emitting layer and the functional layer in contact with the light-emitting layer and the functional layer, the intermediate layer including a fluoride of a second metal, the second metal being an alkali metal or an alkaline earth metal;
   a light-transmitting conductive layer disposed on the functional layer in contact with the functional layer and composed of a metallic oxide; and
   a cathode disposed on the light-transmitting conductive layer in contact with the light-transmitting conductive layer and composed of a third metal, wherein
   the functional layer has a film thickness of 15 to 35 nm, and
   a surface of the anode on a side of the light-emitting layer and an interface between the cathode and the light-transmitting conductive layer are spaced from each other by not less than 150 nm.

2. The organic electroluminescence element according to claim 1, wherein the second metal is sodium.

3. The organic electroluminescence element according to claim 1, further comprising a substrate, wherein
   the anode is disposed over the substrate in a light emitting direction of the organic electroluminescence element, and
   the light-emitting layer is disposed over the hole injection layer in the light emitting direction of the organic electroluminescence element.

4. The organic electroluminescence element according to claim 1, further comprising:
   a substrate;
   an interlayer insulating layer disposed on the substrate in a light emitting direction of the organic electroluminescence element, wherein the anode is disposed on the interlayer insulating layer; and
   a hole transport layer disposed on the hole injection layer in the light emitting direction of the organic electroluminescence element, wherein the partition wall layer is in contact with the interlayer insulating layer, the anode, the hole injection layer, and the hole transport layer.

5. A method of manufacturing an organic electroluminescence element, the method comprising:
   forming an anode;
   forming a hole injection layer on the anode;
   forming a partition wall layer on a region of the hole injection layer;
   forming a light-emitting layer over the hole injection layer, wherein the light-emitting layer is in contact with the partition wall layer;
   forming an intermediate layer on the light-emitting layer in contact with the light-emitting layer;
   forming a functional layer on the intermediate layer in contact with the intermediate layer, the functional layer including a metallic material;
   forming a light-transmitting conductive layer on the functional layer in contact with the functional layer, the light-transmitting conductive layer composed of a metallic oxide; and
   forming a cathode on the light-transmitting conductive layer in contact with the light-transmitting conductive layer, the cathode composed of a first metal, wherein
   the intermediate layer is formed such as to include a fluoride of a second metal, the second metal being an alkali metal or an alkaline earth metal,
   the functional layer is formed such as to have a film thickness of 15 to 35 nm, and
   the light-transmitting conductive layer is formed such that a surface of the anode on a side of the light-emitting layer and an interface between the cathode and the light-transmitting conductive layer are spaced from each other by not less than 150 nm.

6. The method of manufacturing the organic electroluminescence element according to claim 5, wherein the second metal of the intermediate layer is sodium.

* * * * *